US012648156B2

(12) United States Patent
Lee et al.

(10) Patent No.: US 12,648,156 B2
(45) Date of Patent: Jun. 2, 2026

(54) SEMICONDUCTOR CHIP STACK STRUCTURE, SEMICONDUCTOR PACKAGE, AND METHODS OF MANUFACTURING THEM

(71) Applicant: Samsung Electronics Co., Ltd., Suwon-si (KR)

(72) Inventors: Taeyoung Lee, Suwon-si (KR); Kyungdon Mun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 423 days.

(21) Appl. No.: 18/355,004

(22) Filed: Jul. 19, 2023

(65) Prior Publication Data

US 2024/0032312 A1 Jan. 25, 2024

(30) Foreign Application Priority Data

Jul. 20, 2022 (KR) ........................ 10-2022-0089686

(51) Int. Cl.
  *H10B 80/00* (2026.01)
  *H01L 23/00* (2006.01)
  (Continued)

(52) U.S. Cl.
  CPC ......... *H10B 80/00* (2023.02); *H01L 23/5384* (2013.01); *H01L 24/16* (2013.01); *H01L 25/0652* (2013.01); *H01L 2224/16227* (2013.01)

(58) Field of Classification Search
  CPC ................. H01L 25/0652; H01L 25/50; H01L 2924/14364; H01L 2924/1431;
  (Continued)

(56) References Cited

U.S. PATENT DOCUMENTS 9,753,858 B2 9/2017 Loh et al.
10,083,722 B2 9/2018 Oh et al.
(Continued)

FOREIGN PATENT DOCUMENTS

CN 111492477 A * 8/2020 ............. H01L 25/50
CN 115004363 A * 9/2022 ......... H01L 25/0657
(Continued)

OTHER PUBLICATIONS

Young-Cheon Kwon et al., 'A 20nm 6GB Function-in-Memory DRAM, Based on HBM2 with a 1.2TFLOPS Programmable Computing Unit Using Bank-Level Parallelism, for Machine Learning Applications' ISSCC 2021, Session 25, DRAM, 25.4, https://ieeexplore.ieee.org/document/9365862.
(Continued)

*Primary Examiner* — Lawrence C Tynes, Jr.
(74) *Attorney, Agent, or Firm* — HARNESS, DICKEY & PIERCE, P.L.C.

(57) ABSTRACT

A semiconductor chip stack structure may include a buffer chip, a first memory chip on the buffer chip and including a plurality of first banks, a second memory chip on the first memory chip and including a plurality of second banks, first chiplets between the first memory chip and the second memory chip and configured to perform calculations on data stored in the plurality of first banks of the first memory chip, second chiplets between the first memory chip and the second memory chip and configured to perform calculations on data stored in the plurality of second banks of the second memory chip, and a third memory chip on the buffer chip. The third memory chip may include a plurality of third banks. The third memory chip may be electrically connected to the first memory chip and the second memory chip.

20 Claims, 18 Drawing Sheets

(51) Int. Cl.
    *H01L 23/538*    (2006.01)
    *H01L 25/065*    (2023.01)

(58) Field of Classification Search
    CPC ............... H01L 25/074; H01L 25/0657; H01L
               2225/06541; H01L 23/5384; H03K
               19/1776; G06N 3/02; G06N 3/042; G06N
               3/043; G06N 3/0442; G06N 3/044; G06N
               3/045; G06N 3/0455; G06N 20/00; G06N
               20/10; G06N 20/20; G11C 8/10; G11C
               8/16; G06F 15/781; H10B 80/00; H10B
               53/20; H10B 12/315; H10B 43/35
    See application file for complete search history.

(56) References Cited

U.S. PATENT DOCUMENTS

| | | |
|---|---|---|
| 10,509,752 B2 | 12/2019 | Schreiber et al. |
| 10,924,269 B1 | 2/2021 | Ding et al. |
| 11,043,472 B1 | 6/2021 | Dokania et al. |
| 11,139,270 B2 | 10/2021 | Manipatruni et al. |
| 11,301,399 B2 | 4/2022 | Kwon et al. |

| | | | | |
|---|---|---|---|---|
| 2010/0078635 | A1 | 4/2010 | Kuroda et al. | |
| 2016/0315071 | A1* | 10/2016 | Zhai | H01L 25/105 |
| 2018/0095127 | A1* | 4/2018 | Pappu | H03K 19/17736 |
| 2019/0303042 | A1 | 10/2019 | Kim et al. | |
| 2020/0119736 | A1* | 4/2020 | Weber | H03K 19/17756 |
| 2020/0210296 | A1* | 7/2020 | Kang | G11C 29/1201 |
| 2021/0247910 | A1 | 8/2021 | Kim et al. | |
| 2022/0392519 | A1* | 12/2022 | Osborne | H01L 25/18 |
| 2023/0230955 | A1* | 7/2023 | Huh | H01L 25/50 |
| | | | | 257/668 |

FOREIGN PATENT DOCUMENTS

| | | | | |
|---|---|---|---|---|
| KR | 2011/0056205 A | 5/2011 | | |
| KR | 2021/0059417 A | 5/2021 | | |
| KR | 2023/0083103 A | 6/2023 | | |
| WO | WO-2021241048 A1 * | 12/2021 | ......... | G06F 15/7864 |

OTHER PUBLICATIONS

Korean Notice of Allowance dated Apr. 2, 2026 for corresponding Korean Patent Application No. 10-2022-0089686 and its English-language translation.

* cited by examiner

MOUNT FIRST CHIPLETS AND
INTERPOSERS ON FIRST WAFER — P110

FORM FIRST STACKS BY
INDIVIDUALIZING FIRST MEMORY CHIPS — P120

MOUNT SECOND CHIPLETS AND
INTERPOSERS ON SECOND WAFER — P130

FORM SECOND STACKS BY
INDIVIDUALIZING SECOND MEMORY CHIPS — P140

BOND FIRST STACKS AND
SECOND STACKS TO EACH OTHER — P150

MOUNT FIRST CHIPLETS, SECOND CHIPLETS, AND INTERPOSERS ON FIRST WAFER —— P210

BOND SECOND WAFER HAVING FORMED THEREON SECOND MEMORY CHIPS TO FIRST WAFER —— P220

INDIVIDUALIZE FIRST WAFER AND SECOND WAFER —— P230

SEMICONDUCTOR CHIP STACK STRUCTURE, SEMICONDUCTOR PACKAGE, AND METHODS OF MANUFACTURING THEM

CROSS-REFERENCE TO RELATED APPLICATION

This application is based on and claims priority under 35 U.S.C. § 119 to Korean Patent Application No. 10-2022-0089686, filed on Jul. 20, 2022 in the Korean Intellectual Property Office, the disclosure of which is incorporated by reference herein in its entirety.

BACKGROUND

Inventive concepts relate to a semiconductor chip stack structure, a semiconductor package, and methods of manufacturing them.

Semiconductor memory devices may be widely used in high-performance electronic systems. Semiconductor memory device have increased in capacity and speed. A semiconductor memory device may be used to store various types of information, such as data. For example, a semiconductor memory device may be used to store data used for various types of calculation processing, e.g., neural network arithmetic, or to store results of calculation processing. Also, to efficiently perform a large amount of calculations, a method of performing at least some of calculation operations in a memory device has been proposed.

SUMMARY

Inventive concepts provide a semiconductor chip stack structure having improved computational performance, a semiconductor package, and methods of manufacturing them.

According to an embodiment of inventive concepts, a semiconductor chip stack structure may include a buffer chip, a first memory chip on the buffer chip, a second memory chip on the first memory chip, first chiplets between the first memory chip and the second memory chip, second chiplets between the first memory chip and the second memory chip, and a third memory chip on the buffer chip. The first memory chip may include a plurality of first banks. The second memory chip may include a plurality of second banks. The first chiplets may be configured to perform calculations on data stored in the plurality of first banks of the first memory chip. The second chiplets may be configured to perform calculations on data stored in the plurality of second banks of the second memory chip. The third memory chip may include a plurality of third banks. The third memory chip may be electrically connected to the first memory chip and the second memory chip.

According to an embodiment of inventive concepts, a semiconductor chip stack structure may include a first memory chip including a plurality of first banks; a second memory chip on the first memory chip, the second memory chip including a plurality of second banks; and a plurality of chiplets between the first memory chip and the second memory chip. The plurality of chiplets may be configured to perform calculations on data stored in the plurality of first banks and the plurality of second banks.

According to an embodiment of inventive concepts, a semiconductor package may include a redistribution structure, a semiconductor chip stack structure on the redistribution structure, the semiconductor chip stack structure including first memory chips and a plurality of second memory chips stacked on the first memory chips; a plurality of chiplets between two of the plurality of second memory chips adjacent to each other; and a semiconductor chip on the redistribution structure, the semiconductor chip being spaced apart from the semiconductor chip stack structure in a horizontal direction. The first memory chips may include a plurality of first banks, and the plurality of second memory chips may include a plurality of second banks.

BRIEF DESCRIPTION OF THE DRAWINGS

Embodiments of inventive concepts will be more clearly understood from the following detailed description taken in conjunction with the accompanying drawings in which:

FIGS. 4B to 4F are cross-sectional views for describing a method of manufacturing a semiconductor package, according to example embodiments;

FIGS. 5B to 5D are cross-sectional views for describing a method of manufacturing a semiconductor package, according to example embodiments; and FIG. 6 is a cross-sectional view of a semiconductor package according to an embodiment.

DETAILED DESCRIPTION

Figure 1:
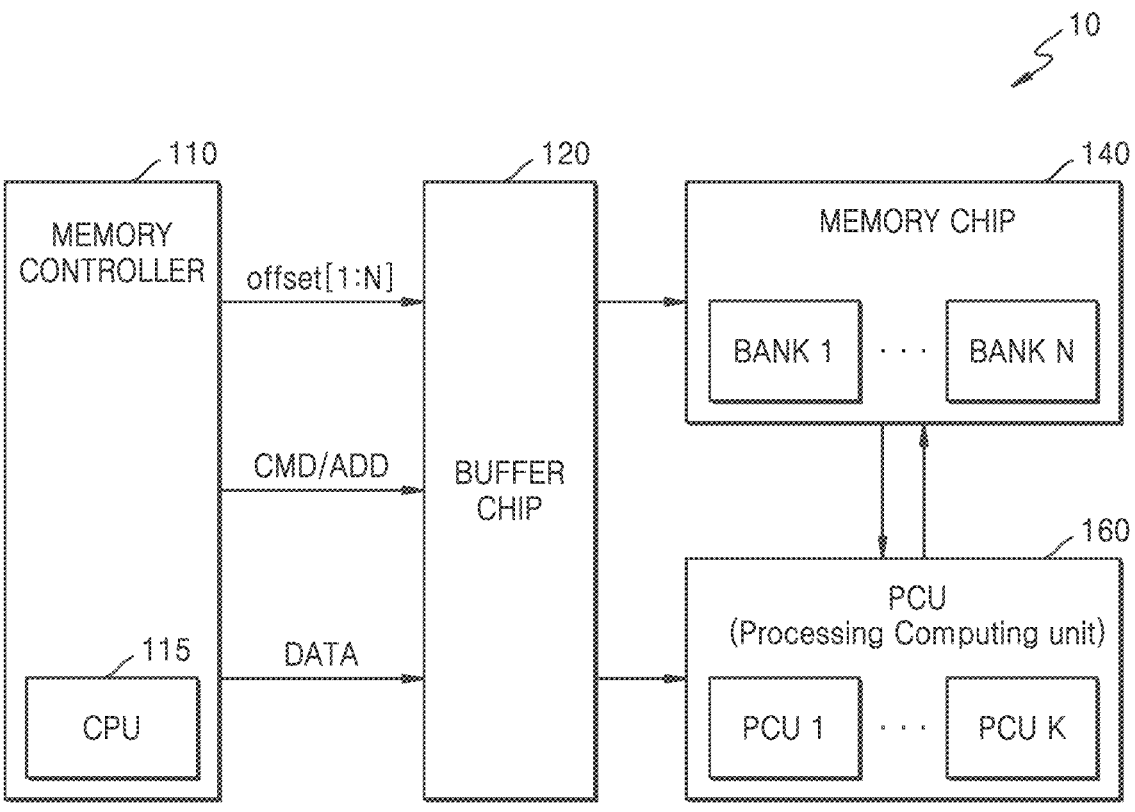
FIG. 1 is a conceptual diagram showing a memory device according to an embodiment.

FIG. 1 is a conceptual diagram showing a memory device 10 according to an embodiment.

Referring to FIG. 1, the memory device 10 may include a memory controller 110, a memory chip 140, a buffer chip 120, and a processing computing unit (PCU) 160. The memory controller 110 may include a memory interface (not shown) and may provide various signals to the buffer chip 120 through the memory interface. According to embodiments, the memory controller 110 may provide a command CMD and an address ADD to the buffer chip 120. The memory controller 110 may access data DATA of the memory chip 140.

The buffer chip 120, the memory chip 140, and the PCU 160 may constitute a 3-dimensional memory structure in which a plurality of chips are stacked. For example, the memory device 10 may be implemented based on a high bandwidth memory (HBM) or a hybrid memory cube (HMC) standard, as well as future evolutions/versions of HBM and/or HMC standards, but inventive concepts are not limited thereto.

The memory controller 110 may access the buffer chip 120, the PCU 160, and the memory chip 140 according to a request from a host. The memory controller 110 may communicate with a host by using various protocols. For example, the memory controller 110 may communicate with the host by using an interface protocol like Peripheral Component Interconnect-Express (PCI-E), Advanced Technology Attachment (ATA), Serial ATA (SATA), Parallel ATA (PATA), or serial attached SCSI (SAS). In addition, various other interface protocols like Universal Serial Bus (USB), Multi-Media Card (MMC), Enhanced Small Disk Interface (ESDI), or Integrated Drive Electronics (IDE) may be applied to communication between a host and the memory controller 110.

According to embodiments, the memory controller 110 may correspond to a host or the memory controller 110 may correspond to a component provided in the host. A host and the memory device 10 may constitute a data processing system. Therefore, the memory device 10 may be defined as a component corresponding to or included in the data processing system.

The memory chip 140 may include a plurality of banks (e.g., first to N-th banks BANK 1 to BANK N). The first to N-th banks BANK 1 to BANK N may each include a memory cell array including a plurality of memory cells. Also, the PCU 160 may include one or more PCU circuits. The PCU 160 may be configured to perform an operation on data stored in the plurality of banks of the memory chip 140.

Meanwhile, the buffer chip 120 may include a decoder. The decoder may perform a decoding operation with respect to a command CMD and an address ADD from the memory controller 110, and the buffer chip 120 may perform an internal control operation with respect to the memory device 10, such that a memory operation is performed according to a decoding result. Also, when a calculation processing operation in the PCU 160 is controlled by the memory controller 110, the buffer chip 120 may perform an internal control operation with respect to the PCU 160, such that the calculation processing operation is performed according to a decoding result.

The memory device 10 may include dynamic random-access memory (DRAM) like double data rate synchronous dynamic random access memory (DDR SDRAM), low power double data rate LPDD (LPDDR) SDRAM, graphics double data rate (GDDR) SDRAM, and Rambus dynamic random access memory (RDRAM). However, embodiments of inventive concepts are not necessarily limited thereto. For example, the memory device 10 may also include a non-volatile memory like flash memory, magnetic RAM (MRAM), ferroelectric RAM (FeRAM), phase change RAM (PRAM), and resistive RAM (ReRAM).

Hereinafter, an example of a calculation processing operation performed inside the PCU 160 according to embodiments will be described. Various types of calculation processing operations may be performed by the PCU 160. For example, at least some of neural network operations configured to perform training for machine learning or an operation according to a result of training may be performed by the PCU 160. A host may control the PCU 160 through the memory controller 110, such that at least some of neural network operations may be performed by the PCU 160.

For example, the memory controller 110 may correspond to a component provided in the host, and it may be described that the host controls the memory device 10. Each PCU circuit of the PCU 160 may perform calculation processing by using information read from any one of a plurality of banks in the memory chip 140 corresponding to the PCU circuit.

Although not shown in FIG. 1, each of first to N-th PCU circuits PCU 1 to PCU K of the PCU 160 may include a calculator and a storage circuit for storing certain information. For example, the first to N-th PCU circuits PCU 1 to PCU K may each include a storage circuit for storing information used for a calculation and/or a result of the calculation.

As an example of operation, data DATA from the memory controller 110 may be provided to each of the first to N-th PCU circuits PCU 1 to PCU K, and the first to N-th PCU circuits PCU 1 to PCU K may perform calculation processing based on the data DATA.

Figure 2:
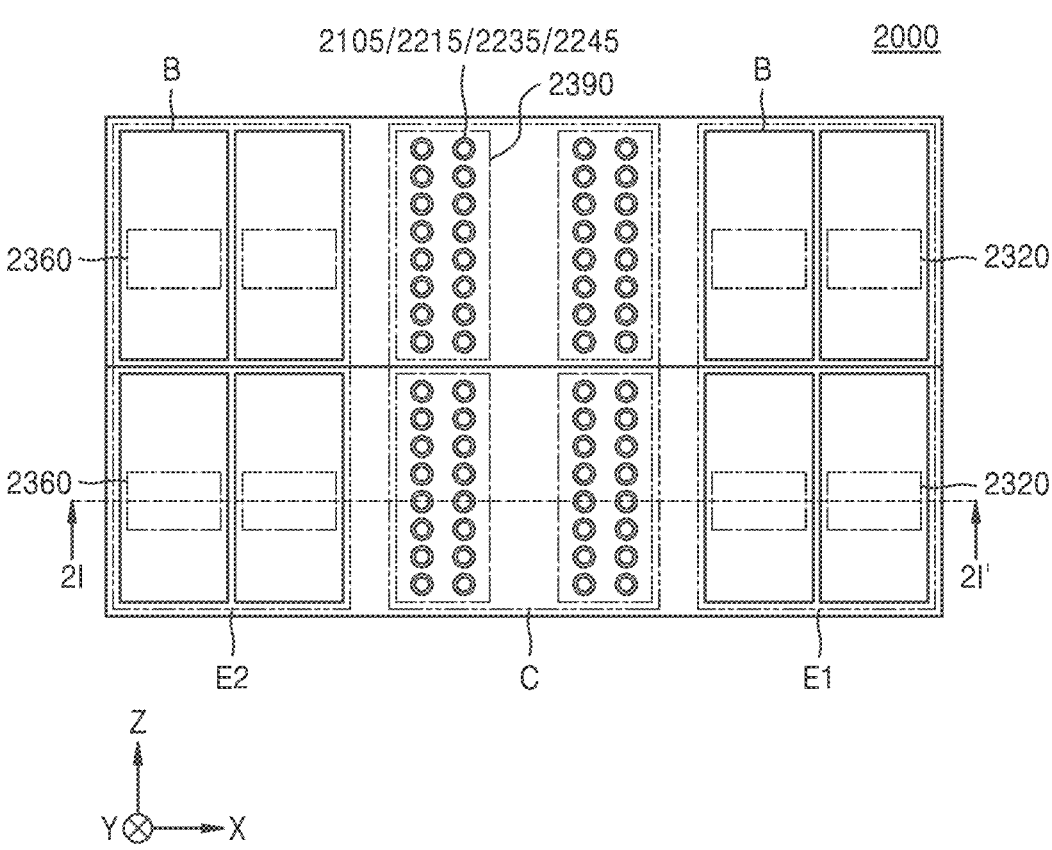
FIG. 2 is a plan view for describing a semiconductor chip stack structure according to an embodiment.

FIG. 2 is a plan view for describing a semiconductor chip stack structure 2000 according to an embodiment. FIGS. 3A to 3E are cross-sectional views taken along a line 2I-2T of FIG. 2 according to embodiments.

Figure 3A:
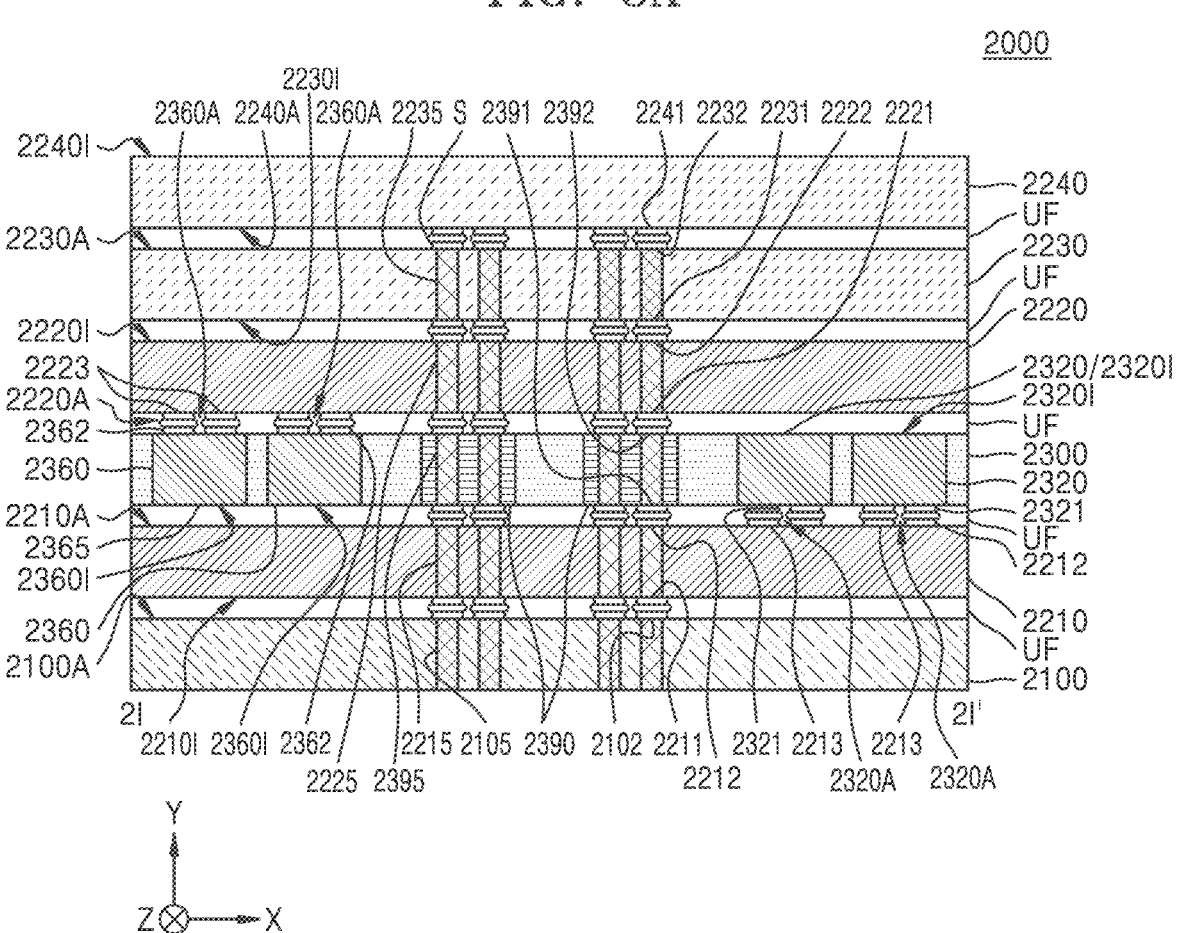
FIGS. 3A to 3E are cross-sectional views taken along a line 2I-2I' of FIG. 2 according to embodiments.

Referring to FIGS. 2 and 3A, the semiconductor chip stack structure 2000 may include a buffer chip 2100, a first memory chip 2210, a second memory chip 2220, a third memory chip 2230, a fourth memory chip 2240, first chiplets 2320, and second chiplets 2360.

Hereinafter, a direction substantially perpendicular to an active surface 2210A of the first memory chip 2210 is defined as the Z direction, and directions substantially parallel to the active surface 2210A of the first memory chip 2210 are defined as the X direction and the Y direction. The X direction, the Y direction, and the Z direction may be substantially perpendicular to one another. Unless defined otherwise, the definitions of the directions are the same in the other drawings.

Also, the Z direction may generally be referred to as a first direction, the X direction may generally be referred to as a second direction, and the Y direction may generally be referred to as a third direction.

The buffer chip 2100 and first to fourth memory chips 2210, 2220, 2230, and 2240 may overlap each other in the first direction. Also, for convenience of illustration, FIG. 2 shows that the first to fourth memory chips 2210, 2220, 2230, and 2240 each include eight banks. However, the number and the arrangement of the banks are not limited to those shown in FIG. 2.

The semiconductor chip stack structure 2000 may further include an underfill UF. The underfill UF may fill spaces between the buffer chip 2100 and the first memory chip 2210, between the first memory chip 2210 and a molding layer 2300, between the molding layer 2300 and the second memory chip 2220, between the second memory chip 2220 and the third memory chip 2230, and between the third memory chip 2230 and the fourth memory chip 2240. The underfill UF may surround solder bumps S. The underfill UF may include an insulating polymer material, e.g., an epoxy resin.

The first to fourth memory chips 2210, 2220, 2230, and 2240 may include, for example, volatile memory chips like DRAM chips or SRAM chips or non-volatile memory chips like PRAM chips, MRAM chips, FeRAM chips, or ReRAM chips. According to some embodiments, the first to fourth memory chips 2210, 2220, 2230, and 2240 may each be a DRAM chip, and the first to fourth memory chips 2210, 2220, 2230, and 2240 may constitute an HBM.

Although FIG. 3A shows an example of the semiconductor chip stack structure 2000 in which the first to fourth memory chips 2210, 2220, 2230, and 2240 are stacked, the number of memory chips stacked in the semiconductor chip stack structure 2000 is not limited thereto. For example, 4 to 32 semiconductor chips may be stacked in the semiconductor chip stack structure 2000.

In the semiconductor chip stack structure 2000, the buffer chip 2100, the first memory chip 2210, the second memory chip 2220, the third memory chip 2230, and the fourth memory chip 2240 may be stacked in the order stated in the third direction. The first chiplets 2320, the second chiplets 2360, and interposers 2390 may be arranged between the first memory chip 2210 and the second memory chip 2220. The first to fourth memory chips 2210, 2220, 2230, and 2240 may not include computing circuits. Since the first to fourth memory chips 2210, 2220, 2230, and 2240 do not include computing circuits, the first to fourth memory chips 2210, 2220, 2230, and 2240 may include more banks than memory chips having computing circuits.

Also, in the case of a conventional process-in-memory semiconductor chip, different processes (e.g., a logic process and a memory cell process) need to be integrated into the same chip, thereby increasing process difficulty and manufacturing cost. According to embodiments, the semiconductor chip stack structure 2000 may include the first chiplets 2320 and the second chiplets 2360 coupled to the first memory chip 2210 and the second memory chip 2220 that may need relatively large amounts of calculations. Therefore, since the first chiplets 2320 and the second chiplets 2360, which are logic chips, and the first memory chip 2210 and the second memory chip 2220, which are memories, may be manufactured through separate manufacturing processes, the process difficulty may be lowered and the manufacturing costs thereof may be reduced.

Also, distances between the first chiplets 2320 and the second chiplets 2360, which are logic chips, and banks B of the first memory chip 2210 and the second memory chip 2220, which are memories, may be reduced (or minimized). Such a structure may be referred to as a pseudo process-in-memory structure.

The buffer chip 2100 may include buffer pads 2102 arranged on an active surface 2100A of the buffer chip 2100. The buffer chip 2100 may transmit/receive input/output signals to and from the first to fourth memory chips 2210, 2220, 2230, and 2240 through via electrodes. For example, when the memory controller 110 of FIG. 1 transmits a data signal to store data in memory cells, the buffer chip 2100 may transmit the data signal to memory chips through via electrodes, thereby storing the data in the memory cells. The buffer chip 2100 may include interface circuits for communication with the memory controller 110 of FIG. 1. Input/output signals received by the buffer chip 2100 from a host device may be transmitted to memory chips through the via electrodes.

The first to fourth memory chips 2210, 2220, 2230, and 2240 may include active surfaces 2210A, 2220A, 2230A, and 2240A and inactive surfaces 2210I, 2220I, 2230I, and 2240I arranged opposite to the active surfaces 2210A, 2220A, 2230A, and 2240A, respectively. Various types of semiconductor circuits may be formed on the active surfaces 2210A, 2220A, 2230A, and 2240A of the first to fourth memory chips 2210, 2220, 2230, and 2240. A semiconductor circuit may include the above-stated volatile memory device, the above-stated non-volatile memory device, and a core/peri circuit for reading data stored therein or storing data therein.

The first memory chip 2210 may include first lower pads 2212 and first pads 2213 arranged on the active surface 2210A of the first memory chip 2210. First lower pads 2212 may be formed on the inactive surface 2210I of the first memory chip 2210.

The first memory chip 2210 may be connected to the first chiplets 2320. The first pads 2213 may be arranged to the right of the first lower pads 2212 in the second direction. As the first pads 2213, first chiplet lower pads 2321, and the solder bumps S are arranged between the first memory chip 2210 and the first chiplets 2320, the first memory chip 2210 may be electrically connected to the first chiplets 2320. Therefore, the first chiplets 2320 may read data stored in a plurality of first banks of the first memory chip 2210.

The second memory chip 2220 may include second lower pads 2221 and second pads 2223 arranged on the active surface 2220A of the second memory chip 2220. Second lower pads 2222 may be formed on the inactive surface 2220I of the second memory chip 2220. The active surface 2220A of the second memory chip 2220 may face the active surface 2210A of the first memory chip 2210 and active surfaces 2360A of the second chiplets 2360. The active surface 2220A of the second memory chip 2220 may face inactive surfaces 2320I and 2340I of the first chiplets 2320.

As the second lower pads 2222, third lower pads 2231, and the solder bumps S are arranged between the second memory chip 2220 and the third memory chip 2230, the second memory chip 2220 may be electrically connected to the third memory chip 2230.

The second memory chip 2220 may be connected to the second chiplets 2360. As the second pads 2223 and second chiplet lower pads 2362 are arranged between the second memory chip 2220 and the second chiplets 2360, the second memory chip 2220 may be electrically connected to the second chiplets 2360. Therefore, the second chiplets 2360 may read data stored in a plurality of second banks of the second memory chip 2220.

The third memory chip 2230 may include third lower pads 2232 arranged on the active surface 2230A of the third memory chip 2230. The inactive surface 2230I of the third memory chip 2230 may face the active surface 2210A of the first memory chip 2210. The inactive surface 2230I of the third memory chip 2230 may face the inactive surface 2220I of the second memory chip 2220. The inactive surface 2230I of the third memory chip 2230 may face the inactive surfaces 2320I and 2340I of the first chiplets 2320. The inactive surface 2230I of the third memory chip 2230 may face the active surfaces 2360A of the second chiplets 2360.

As the third lower pads 2232, fourth lower pads 2241, and the solder bumps S are arranged between the third memory chip 2230 and the fourth memory chip 2240, the third memory chip 2230 may be electrically connected to the fourth memory chip 2240.

The fourth memory chip 2240 may include the fourth lower pads 2241 arranged on the active surface 2240A of the fourth memory chip 2240. Since the fourth memory chip 2240 is the topmost chip from among the first to fourth memory chips 2210, 2220, 2230, and 2240 stacked in the first direction, the fourth memory chip 2240 may not include a via electrode. The inactive surface 2240A of the fourth memory chip 2240 may face the active surface 2210A of the first memory chip 2210. The inactive surface 2240A of the fourth memory chip 2240 may face the inactive surface 2220I of the second memory chip 2220. The inactive surface 2240A of the fourth memory chip 2240 may face the active surface 2230A of the third memory chip 2230. Also, the inactive surface 2240A of the fourth memory chip 2240 may face the inactive surfaces 2320I and 2340I of the first chiplets 2320 and face the active surfaces 2360A of the second chiplets 2360.

The first chiplets 2320 may be configured to perform calculations on data stored in a plurality of first banks of the first memory chip 2210. The first chiplets 2320 may include first chiplet lower pads 2321 arranged on active surfaces 2320A of the first chiplets 2320. Here, the active surface 2210A of the first memory chip 2210 may face the active surfaces 2320A of the first chiplets 2320.

The second chiplets 2360 may be configured to perform calculations on data stored in a plurality of second banks of the second memory chip 2220. The second chiplets 2360 may include the second chiplet lower pads 2362 arranged on the active surfaces 2360A of the second chiplets 2360. Here, the active surface 2210A of the first memory chip 2210 may face inactive surfaces 23601 of the second chiplets 2360. The active surfaces 2320A of the first chiplets 2320 may be opposite to the active surfaces 2360A of the second chiplets 2360.

According to embodiments, the first chiplets 2320 and the second chiplets 2360 may correspond to the PCU 160 (refer to FIG. 1). According to embodiments, the first chiplets 2320 and the second chiplets 2360 may overlap a first edge region E1 and a second edge region E2 of the first memory chip 2210 and the second memory chip 2220, respectively. According to embodiments, the first chiplets 2320 and the second chiplets 2360 may be horizontally (e.g., in the second direction) spaced apart from each other around interposers 2390 provided therebetween. The first chiplets 2320 may be arranged in the first edge region E1 of the molding layer 2300. The second chiplets 2360 may be arranged in the second edge region E2 of the molding layer 2300.

The interposer 2390 may include interposer lower pads 2391 arranged on the bottom surfaces of the interposers 2390. As the first lower pads 2212, the interposer lower pads 2391, and the solder bumps S are provided between the first memory chip 2210 and the interposers 2390, the first memory chip 2210 may be electrically connected to the interposers 2390. According to embodiments, the interposers 2390 may overlap central regions C of the first memory chip 2210 and the second memory chip 2220. According to embodiments, the interposers 2390 may be provided between the first chiplets 2320 and the second chiplets 2360.

The interposers 2390 may include interposer upper pads 2392 disposed on the top surfaces of the interposers 2390. As the interposer upper pads 2392, the second lower pads 2221, and the solder bumps S are provided between the interposers 2390 and the second memory chip 2220, the second memory chip 2220 may be electrically connected to the interposers 2390. The first memory chip 2210 may be electrically connected to the second memory chip 2220 through the interposers 2390.

The first chiplets 2320, the second chiplets 2360, and the interposers 2390 may be arranged on the top surface of the first memory chip 2210. Also, the first chiplets 2320, the second chiplets 2360, and the interposers 2390 may be arranged at the same height from the buffer chip 2100 in the first direction (e.g., the Y-axis direction). The interposers 2390 may overlap central portions of the first memory chip 2210 and the second memory chip 2220.

The solder bumps S may be arranged between the buffer pads 2102 and the first lower pads 2212. Therefore, the first memory chip 2210 may be electrically connected to the buffer chip 2100 through the solder bumps S. The solder bumps S may include a solder material. The solder material may include tin (Sn), indium (In), bismuth (Bi), antimony (Sb), copper (Cu), silver (Ag), zinc (Zn), lead (Pb), and/or an alloy thereof of.

Pads in the semiconductor chip stack structure 2000 may have a polygonal shape, e.g., a rectangular shape or a hexagonal shape. According to embodiments, the pads in the semiconductor chip stack structure 2000 may have a circular shape or an elliptical shape when viewed from above. According to embodiments, the pads in the semiconductor chip stack structure 2000 may include at least one metal selected from among tungsten (W), aluminum (Al), and copper (Cu).

However, inventive concepts are not limited thereto. Each chip may be coupled each other by direct bonding, the and solder bumps S between chips (e.g., the solder bumps S between the first memory chip 2210 and the buffer chip 2100) may be omitted.

The buffer chip 2100 may include buffer via electrodes 2105. Also, first to third memory chips 2210, 2220, and 2230 may include first to third via electrodes 2215, 2225, and 2235, respectively. The interposers 2390 may include interposer via electrodes 2395. The buffer via electrodes 2105 may be electrically connected to first via electrodes 2215, the interposer via electrodes 2395, second via electrodes 2225, third via electrodes 2235, and fourth via electrodes 2245.

The first to third via electrodes 2215, 2225, and 2235 and the interposer via electrodes 2395 may have column-like shapes.

The first via electrodes 2215 may penetrate through the first memory chip 2210 in the Z direction. The first via electrodes 2215 may extend in the Z direction. The first via electrodes 2215 may be connected to the interposer via electrodes 2395.

The second via electrodes 2225 may penetrate through the second memory chip 2220 in the Z direction perpendicular to the top surface of the buffer chip 2100. The second via electrodes 2225 may extend in the Z direction. The second via electrodes 2225 may be connected to the interposer via electrodes 2395.

The third via electrodes 2235 may penetrate through the third memory chip 2230 in the Z direction perpendicular to the top surface of the buffer chip 2100. The third via electrodes 2235 may extend in the Z direction. Also, the third via electrodes 2235 may be connected to the second via electrodes 2225.

The first to third via electrodes 2215, 2225, and 2235 and the interposer via electrodes 2395 may each include a barrier layer defining the surface of a column and a buried conductive layer filling the inside of the barrier layer. The barrier layer may include at least one from among titanium (Ti), titanium nitride (TiN), tantalum (Ta), or tantalum nitride (TaN), rubidium (Ru), cobalt (Co), manganese (Mn), tungsten nitride (WN), nickel (Ni), and nickel boronide (NiB), and the buried conductive layer may include at least one from among Cu alloys like Cu, CuSn, CuMg, CuNi, CuZn, CuPd, CuAu, CuRe, and CuW, W, W alloys, Ni, Ru, and Co.

The molding layer 2300 may be formed between the first memory chip 2210 and the second memory chip 2220. The molding layer 2300 may include the first chiplets 2320, the second chiplets 2360, and the interposers 2390. According to embodiments, the molding layer 2300 may cover a portion of the top surface of the first memory chip 2210 and a portion of the bottom surface of the second memory chip 2220. According to embodiments, the molding layer 2300 may cover side surfaces of the first chiplets 2320, the second chiplets 2360, and the interposers 2390. The molding layer 2300 may include, for example, an epoxy mold compound (EMC).

Figure 3B:
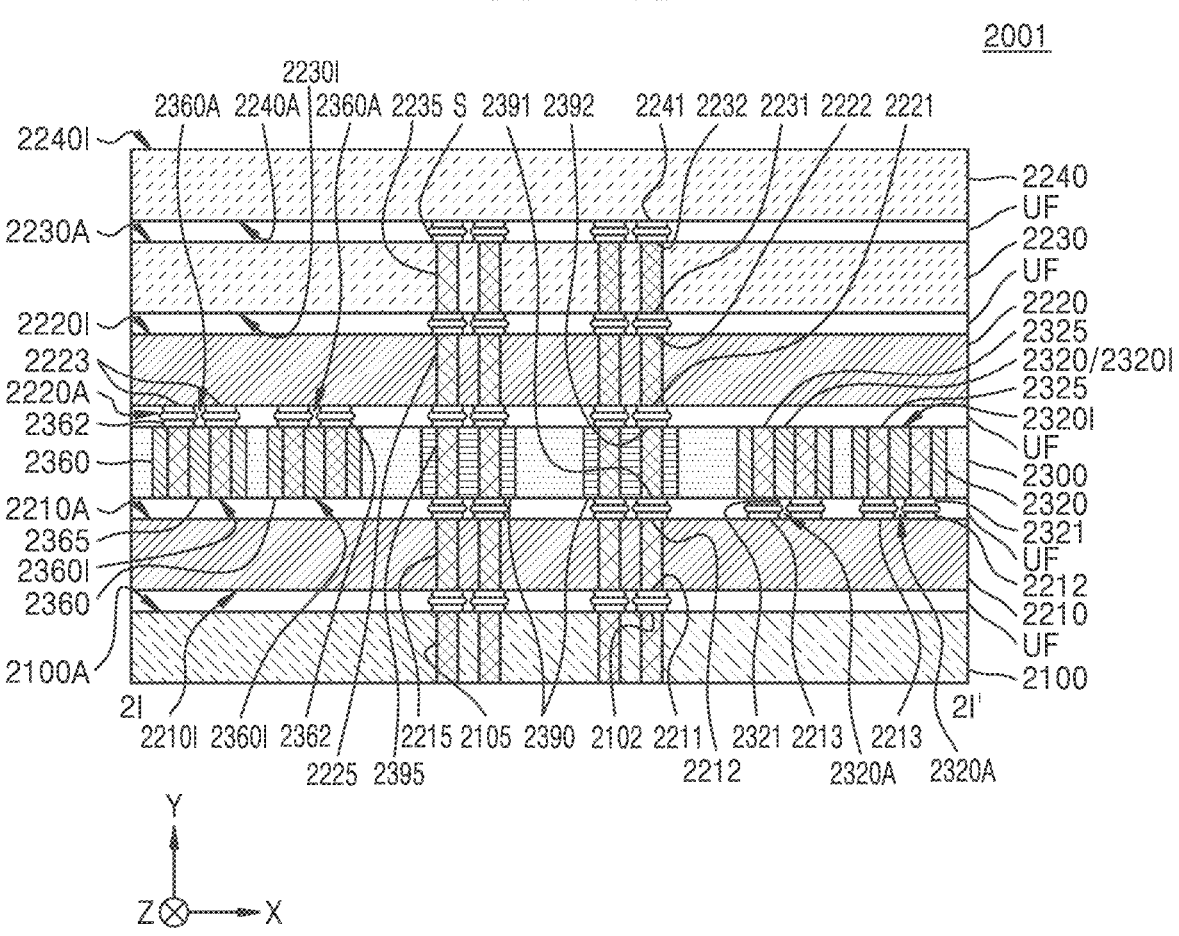

FIG. 3B is a cross-sectional view for describing a semiconductor chip stack structure 2001 according to some other embodiments.

In detail, FIG. 3B is a cross-sectional view for describing a semiconductor chip stack structure in which a plurality of chiplets, that is, the first chiplets 2320 and the second chiplets 2360, of FIG. 3A include first chiplet via electrodes 2325 and second chiplet via electrodes 2365. For convenience of explanation, descriptions identical to those already given above with reference to FIG. 3A will be omitted, and descriptions below will focus on differences therefrom.

Referring to FIG. 3B, the first chiplets 2320 and the second chiplets 2360 may include the first chiplet via electrodes 2325 and the second chiplet via electrodes 2365, respectively. The first chiplet via electrodes 2325 and the second chiplet via electrodes 2365 may have column-like shapes.

The first chiplet via electrodes 2325 and the second chiplet via electrodes 2365 may each include a barrier layer and a buried conductive layer, like the first to third via electrodes 2215, 2225, and 2235. The first chiplet via electrodes 2325 and the second chiplet via electrodes 2365 may be dummy via electrodes for dissipating heat generated by operations of the first chiplets 2320 and the second chiplets 2360, respectively.

The first chiplet via electrodes 2325 may penetrate through the first chiplets 2320 in the Z direction perpendicular to the top surface of the buffer chip 2100. The first chiplet via electrodes 2325 may extend in the Z direction.

The second chiplet via electrodes 2365 may penetrate through the second chiplets 2360 in the Z direction perpendicular to the top surface of the buffer chip 2100. The second chiplet via electrodes 2365 may extend in the Z direction.

Figure 3C:
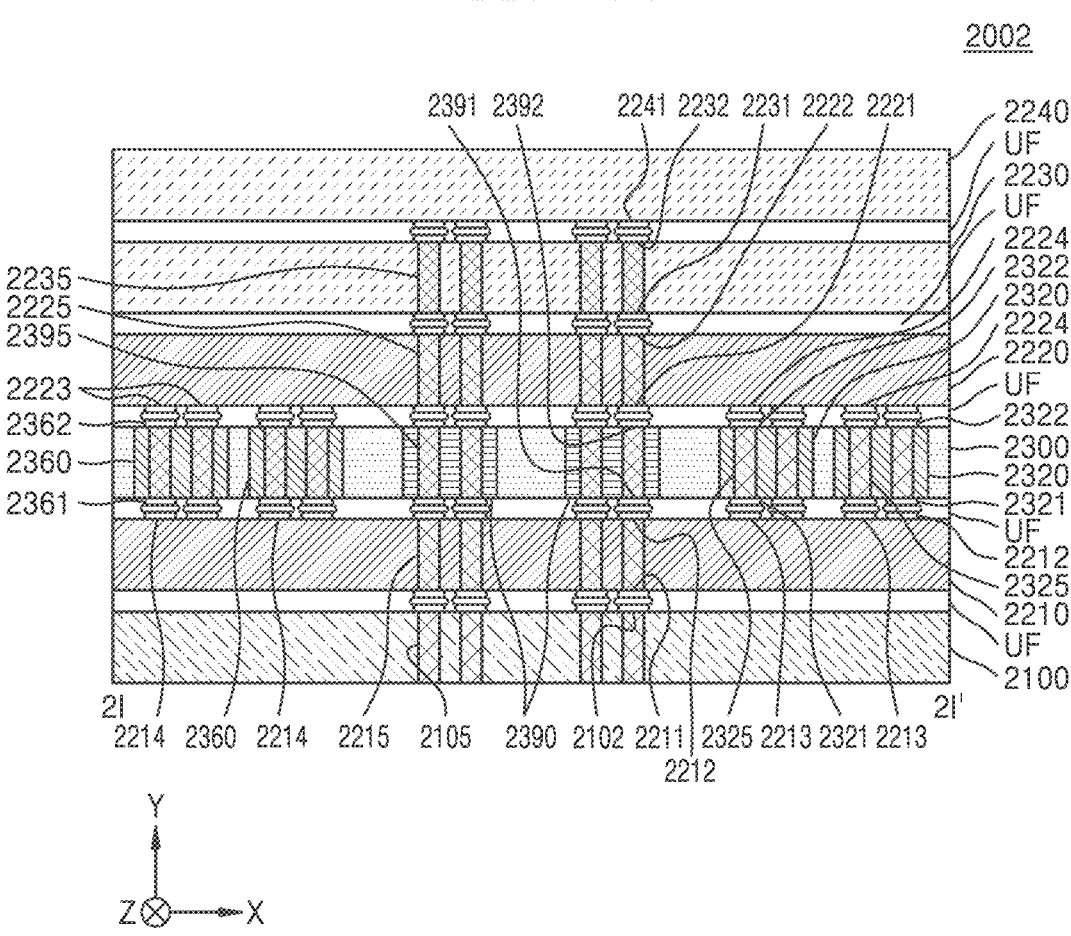

FIG. 3C is a cross-sectional view for describing a semiconductor chip stack structure 2002 according to some other embodiments.

In detail, FIG. 3C is a cross-sectional view for describing a structure in which all of a plurality of chiplets, that is, the first chiplets 2320 and the second chiplets 2360, are connected to the first memory chip 2210 and the second memory chip 2220. For convenience of explanation, descriptions identical to those already given above with reference to FIGS. 3A and 3B will be omitted, and descriptions below will focus on differences therefrom.

Referring to FIG. 3C, second chiplet lower pads 2361 may be arranged on the bottom surfaces of the second chiplets 2360. First chiplet upper pads 2322 may be arranged on the top surfaces of the first chiplets 2320.

Third pads 2214 may be formed on the top surface of the first memory chip 2210. The first lower pads 2212, the first pads 2213, and the third pads 2214 may be arranged on the active surface 2210A of the first memory chip 2210. Also, the first lower pads 2212, the first pads 2213, and the third pads 2214 may be spaced apart from one another.

Also, fourth pads 2224 may be formed on the bottom surface of the second memory chip 2220. The second lower pads 2221, the second pads 2223, and the fourth pads 2224 may be arranged on the active surface 2220A of the second memory chip 2220. Also, the second lower pads 2221, the second pads 2223, and the fourth pads 2224 may be spaced apart from one another.

According to embodiments, the first lower pads 2212, the first pads 2213, and the third pads 2214 may overlap one another in the second direction. According to embodiments, the second lower pads 2221, the second pads 2223, and the fourth pads 2224 may overlap one another in the second direction. According to embodiments, the first chiplet upper pads 2322 and the second chiplet lower pads 2362 may overlap each other in the second direction. According to embodiments, the first chiplet lower pads 2321 and the second chiplet lower pads 2361 may overlap each other in the second direction.

The first chiplets 2320 may perform calculations on data stored in any one of a plurality of first banks of the first memory chip 2210 and any one of a plurality of second banks of the second memory chip 2220 through the first chiplet via electrodes 2325.

Here, a second wiring layer may be formed on the active surface 2220A of the second memory chip 2220. Data stored in the plurality of second banks of the second memory chip 2220 may be provided to the first chiplets 2320 through the second wiring layer, the fourth pads 2224, the solder bumps S, and the first chiplet upper pads 2322. The first chiplets 2320 may read data through the first pads 2213 formed on the first memory chip 2210 and the fourth pads 2224 formed on the second memory chip 2220.

The second chiplets 2360 may perform calculations on data stored in any one of the plurality of first banks of the first memory chip 2210 and any one of the plurality of second banks of the second memory chip 2220 through the second chiplet via electrodes 2365.

Data stored in the plurality of first banks of the first memory chip 2210 may be provided to the second chiplets 2360 through a first wiring layer, the third pads 2214, the solder bumps S, and the second chiplet lower pads 2361. The second chiplets 2360 may read data through the third pads 2214 formed on the first memory chip 2210 and the second pads 2223 formed on the second memory chip 2220.

Referring to FIGS. 1 and 3C, the first chiplets 2320 may perform calculations on data stored in the plurality of first banks of the first memory chip 2210 adjacent to the first chiplets 2320. For example, the first chiplets 2320 may perform calculations on data stored in banks located in the first edge region E1 from among the plurality of first banks of the first memory chip 2210.

Also, the first chiplets 2320 may perform calculations on data stored in the plurality of second banks of the second memory chip 2220 adjacent to the first chiplets 2320. For example, the first chiplets 2320 may perform calculations on data stored in banks located in the first edge region E1 from among the plurality of second banks of the second memory chip 2220.

The second chiplets 2360 may perform calculations on data stored in the plurality of first banks of the first memory chip 2210 adjacent to the second chiplets 2360. For example, the second chiplets 2360 may perform calculations on data stored in banks located in the second edge region E2 from among the plurality of first banks of the first memory chip 2210.

Also, the second chiplets 2360 may perform calculations on data stored in the plurality of first banks of the second memory chip 2220 adjacent to the second chiplets 2360. For example, the second chiplets 2360 may perform calculations on data stored in banks located in the second edge region E2 from among the plurality of first banks of the second memory chip 2220.

Figure 3D:
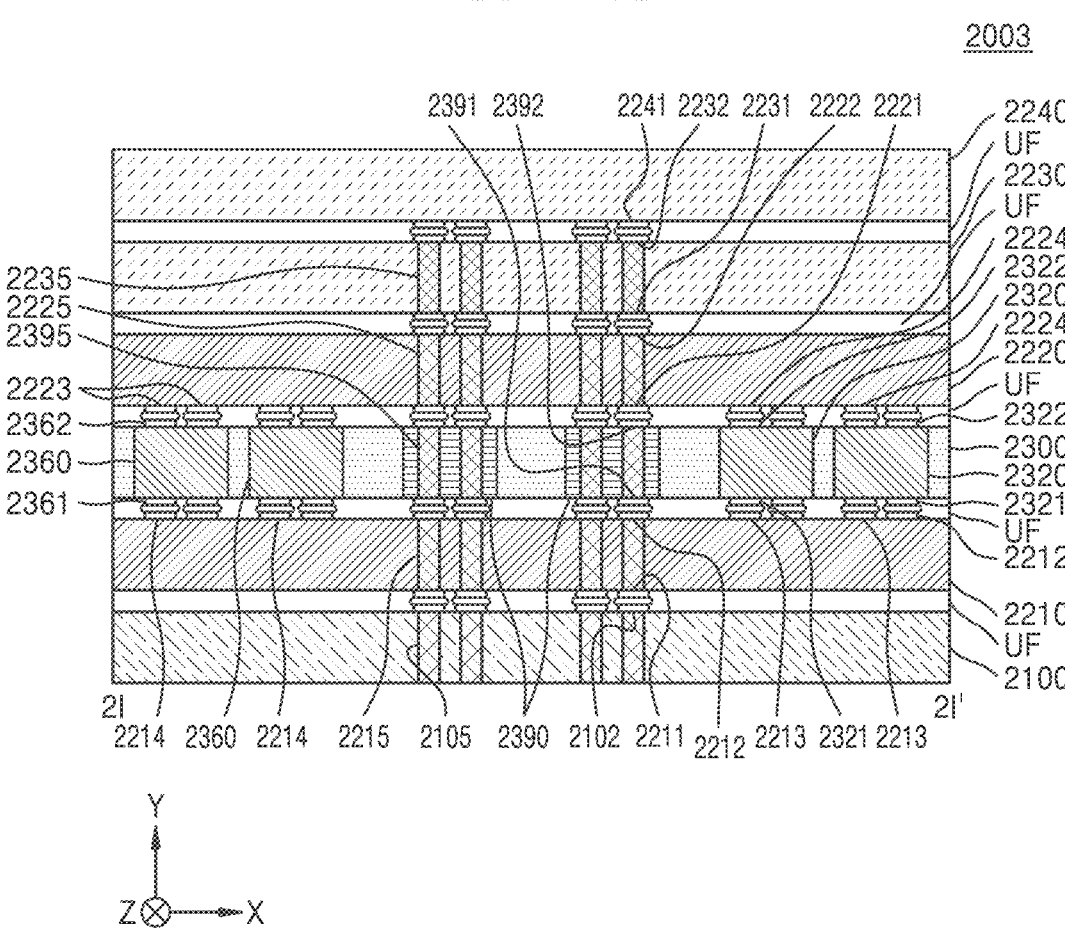

FIG. 3D is a cross-sectional view for describing a semiconductor chip stack structure 2003 according to some other embodiments.

In detail, FIG. 3D is a cross-sectional view for describing a semiconductor chip stack structure in which a plurality of chiplets, that is, the first chiplets 2320 and the second chiplets 2360, of FIG. 3A do not include the first chiplet via electrodes 2325 and the second chiplet via electrodes 2365. For convenience of explanation, descriptions identical to those already given above with reference to FIGS. 3A to 3C will be omitted, and descriptions below will focus on differences therefrom.

Referring to FIG. 3D, the first chiplets 2320 and second chiplets 2360 may not include the first chiplet via electrodes 2325 and the second chiplet via electrodes 2365, respectively.

Here, the first chiplets 2320 may read data of each of the first memory chip 2210 and the second memory chip 2220.

According to embodiments, the first memory chip 2210 may provide data to the first chiplets 2320 through the first wiring layer, the first pads 2213, the solder bumps S, and the first chiplet lower pads 2321. According to embodiments, the second memory chip 2220 may provide data to the first chiplets 2320 through the second wiring layer, the fourth pads 2224, the solder bumps S, and the first chiplet upper pads 2322.

According to embodiments, any one of second chiplet lower pads 2361 and 2362 may be a dummy pad. According to embodiments, any one of the second chiplet lower pads 2361 and 2362 may be electrically floated. Here, any one of the second chiplet lower pads 2361 and 2362 being electrically floated means that any one of the second chiplet lower pads 2361 and 2362 is electrically insulated from semiconductor circuits formed on active surfaces 2210A and 2220A of the first memory chip 2210 and the second memory chip 2220 and active surfaces of the second chiplets 2360. According to embodiments, any one of the second chiplet lower pads 2361 and 2362 may be a thermal pad for dissipating heat generated by the operation of the second chiplets 2360. Therefore, the operating temperature according to the operating performance of the second chiplets 2360 may be reduced, and thus the reliability of the operation of a semiconductor chip stack structure 2003 may be improved.

Figure 3E:
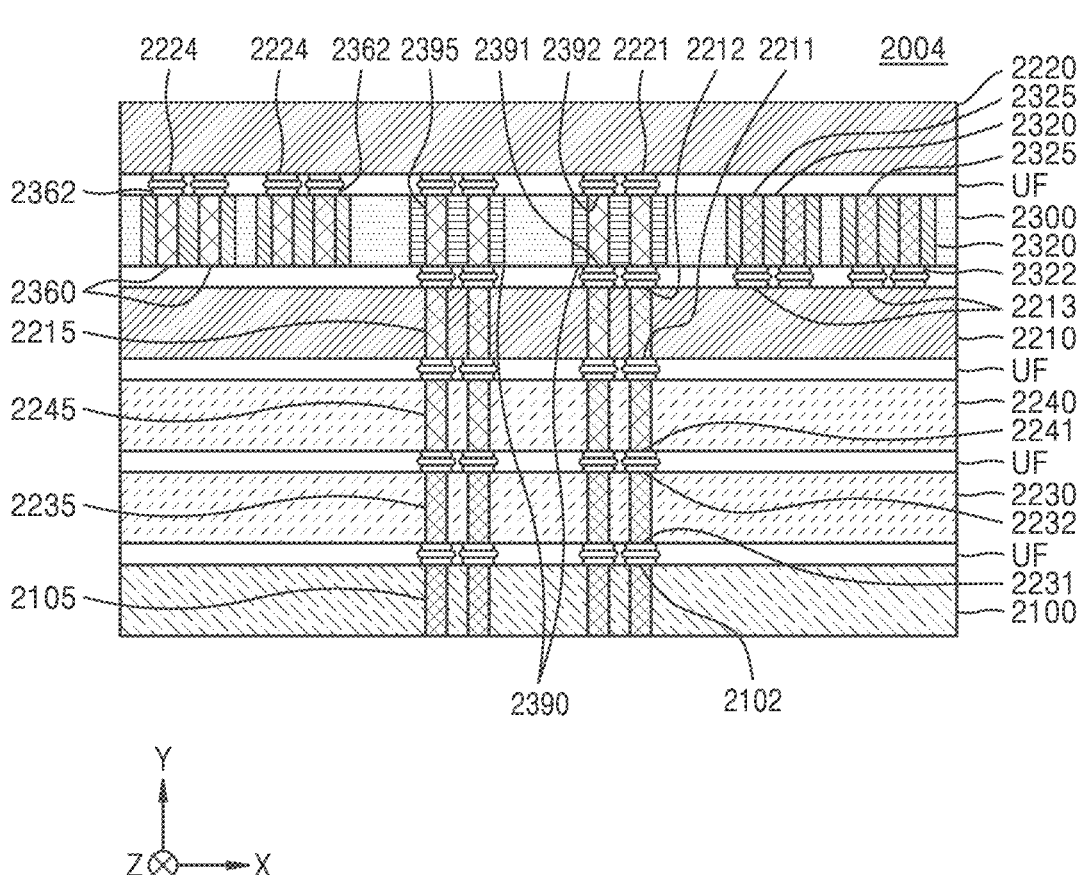

FIG. 3E is a cross-sectional view for describing a semiconductor chip stack structure 2004 according to some other embodiments.

In detail, FIG. 3E is a cross-sectional view for describing a semiconductor chip stack structure in which the first to fourth memory chips 2210, 2220, 2230, and 2240 are stacked in a different order. For convenience of explanation, descriptions identical to those already given above with reference to FIGS. 3A to 3D will be omitted, and descriptions below will focus on differences therefrom.

Referring to FIGS. 1 and 3E, according to embodiments, in the semiconductor chip stack structure 2004, the buffer chip 2100, the third memory chip 2230, the fourth memory chip 2240, the first memory chip 2210, and the second memory chip 2220 may be stacked in the order stated in the vertical direction. Here, the first chiplets 2320, the second chiplets 2360, and interposers 2390 may be arranged between the first memory chip 2210 and the second memory chip 2220.

According to embodiments, in the semiconductor chip stack structure 2004, the third memory chip 2230 may be stacked on the buffer chip 2100. The fourth memory chip 2240 may be stacked on the third memory chip 2230. Here, the stacking order of the third memory chip 2230 and the fourth memory chip 2240 may be reversed. The molding layer 2300 may be stacked on the fourth memory chip 2240. The molding layer 2300 may include the first chiplets 2320, the second chiplets 2360, and the interposers 2390. The second memory chip 2220 may be stacked on the molding layer 2300.

Although not shown in FIGS. 3A to 3E, according to other embodiments, the first memory chip 2210, the molding layer 2300, and the second memory chip 2220 may be arranged between the third memory chip 2230 and the fourth memory chip 2240.

Referring to FIGS. 1 and 3E, the third memory chip 2230 and the fourth memory chip 2240 may each provide data to a central processing unit CPU 115. Calculations on data stored in the third memory chip 2230 and the fourth memory chip 2240 may not be performed by the semiconductor chip stack structure 2004. Calculations on data stored in the first memory chip 2210 and the second memory chip 2220 may be performed by any one of the first chiplets 2320 and the second chiplets 2360.

Figure 4A:
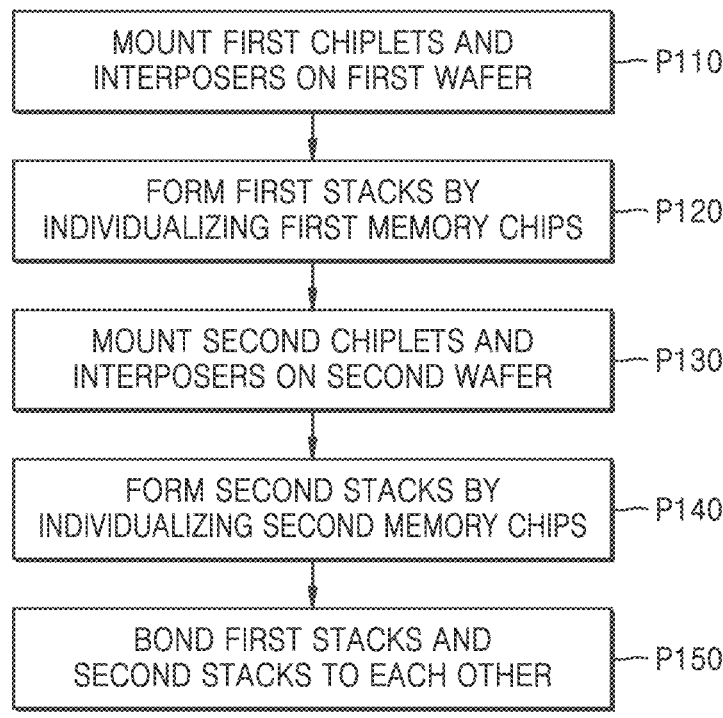
FIG. 4A is a flowchart of a method of manufacturing a semiconductor package, according to example embodiments.

FIG. 4A is a flowchart of a method of manufacturing a semiconductor package, according to example embodiments. FIGS. 4B to 4F are cross-sectional views for describing a method of manufacturing a semiconductor package, according to example embodiments.

Figure 4B:
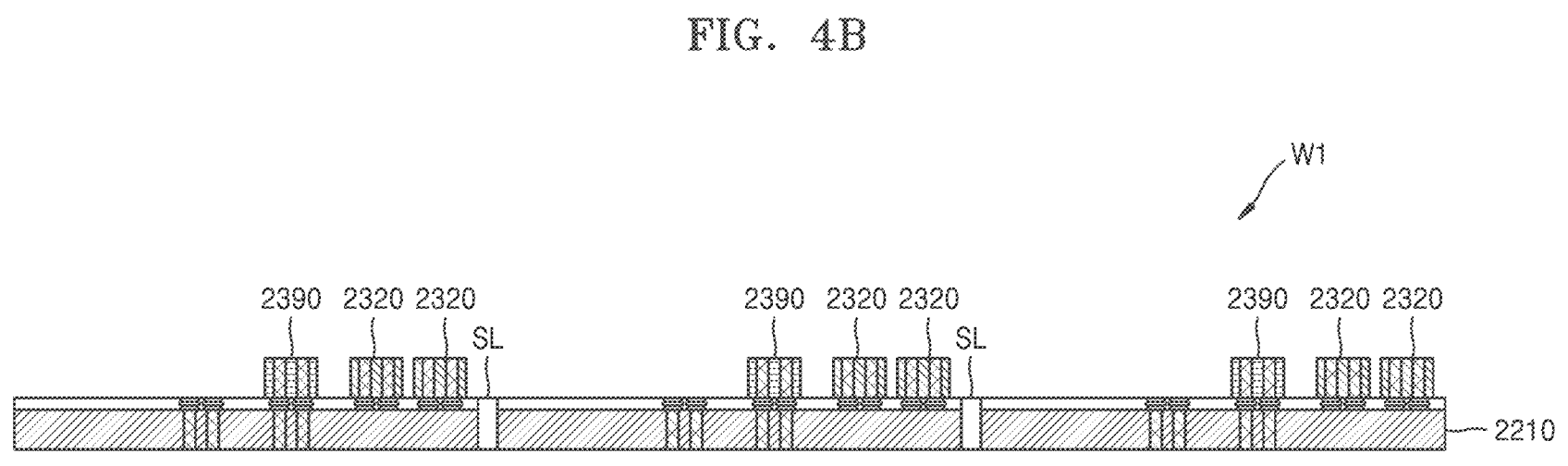

Referring to FIGS. 4A and 4B, the first chiplets 2320 and the interposers 2390 may be mounted on a first wafer W1 on which a plurality of first memory chips 2210 are formed, in operation P110. Here, the first chiplets 2320 and the interposers 2390 may be chip-to-chip bonded to the plurality of first memory chips 2210, respectively. Pads of the first memory chip 2210 and pads of the first chiplets 2320 may be bonded to each other through Cu—Cu hybrid bonding. Hybrid bonding may be a direct pad-to-pad bonding. Also, the pads of the first memory chip 2210 and pads of the interposers 2390 may be bonded to each other through Cu—Cu hybrid bonding. Furthermore, oxide bonding may be employed instead of hybrid bonding.

Figure 4C:
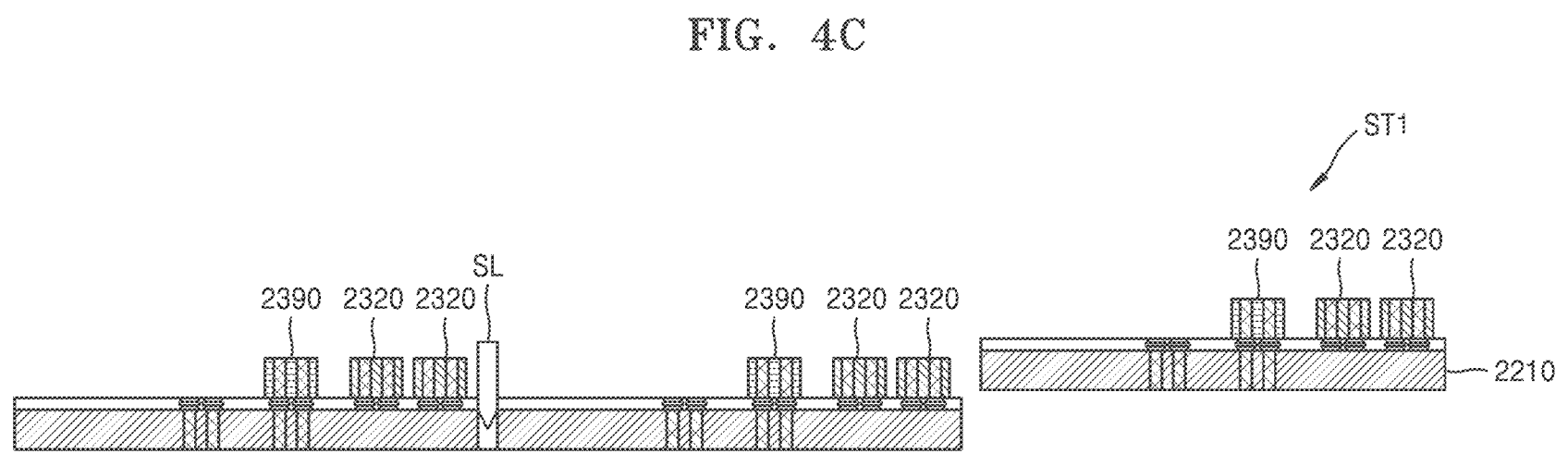

Referring to FIGS. 4A and 4C, first stacks ST1 may be formed by individualizing the plurality of first memory chips 2210 in operation P120. The first wafer W1 may be individualized along a scribe line SL. The first wafer W1 may be separated by a separating means like a blade or a laser.

Figure 4D:
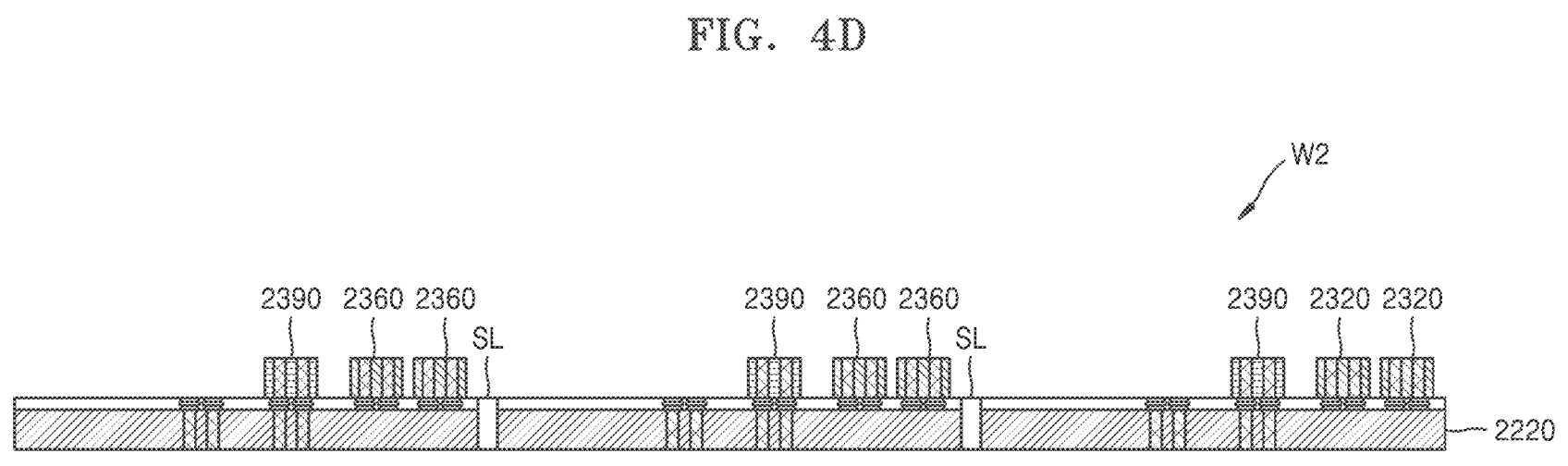

Referring to FIGS. 4A and 4D, the second chiplets 2360 and the interposers 2390 may be mounted on a second wafer W2 on which a plurality of second memory chips are formed, in operation P130. In operation P140, second stacks ST2 may be formed by individualizing the plurality of second memory chips. Operations P130 and P140 may be performed in the same manner as operations P110 and P120.

Figure 4E:
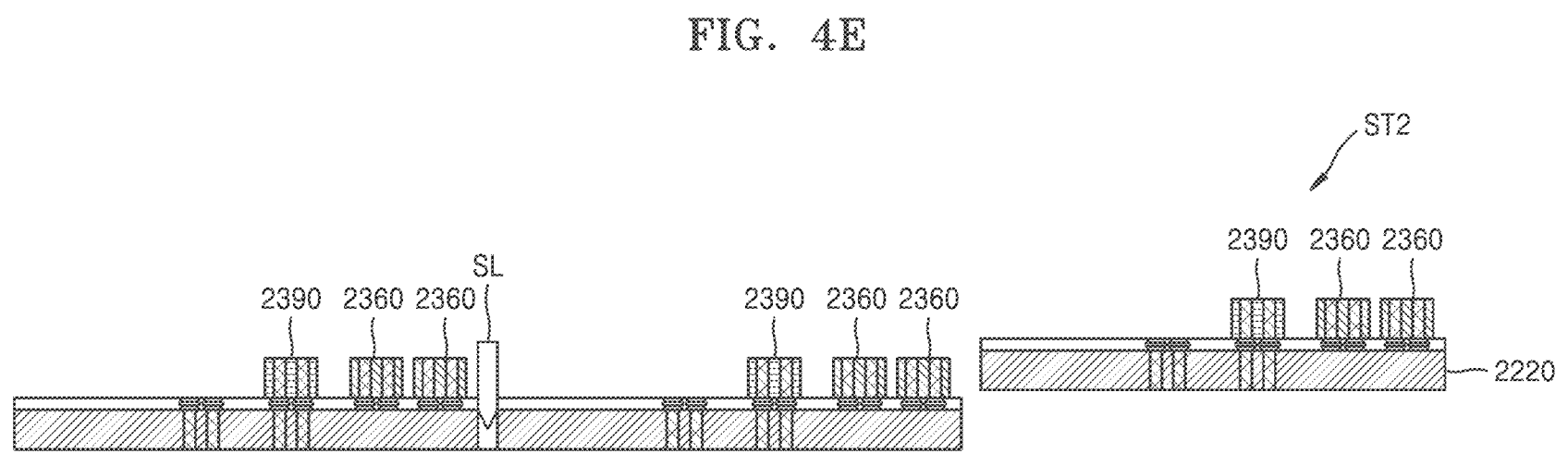
Figure 4F:
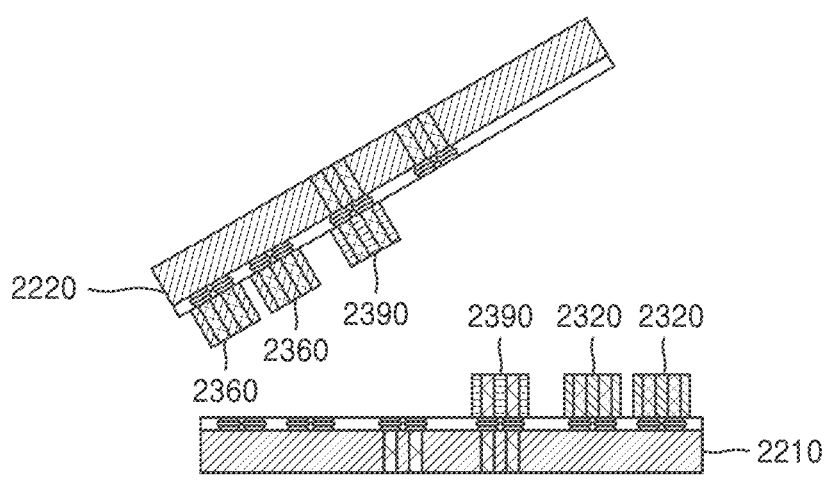

Referring to FIGS. 4A and 4E, the first stacks ST1 and the second stacks ST2 may be bonded in operation P150. Referring to FIGS. 4A and 4F, the second stacks ST2 may be turned over and coupled to the first stacks ST1. The first stacks ST1 and the second stacks ST2 may be coupled to each other by using a thermocompression method.

Figure 5A:
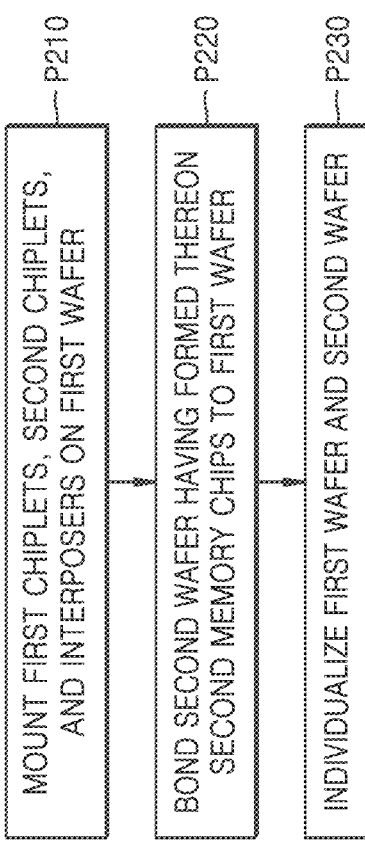
FIG. 5A is a flowchart of a method of manufacturing a semiconductor package, according to example embodiments.
Figure 5B:
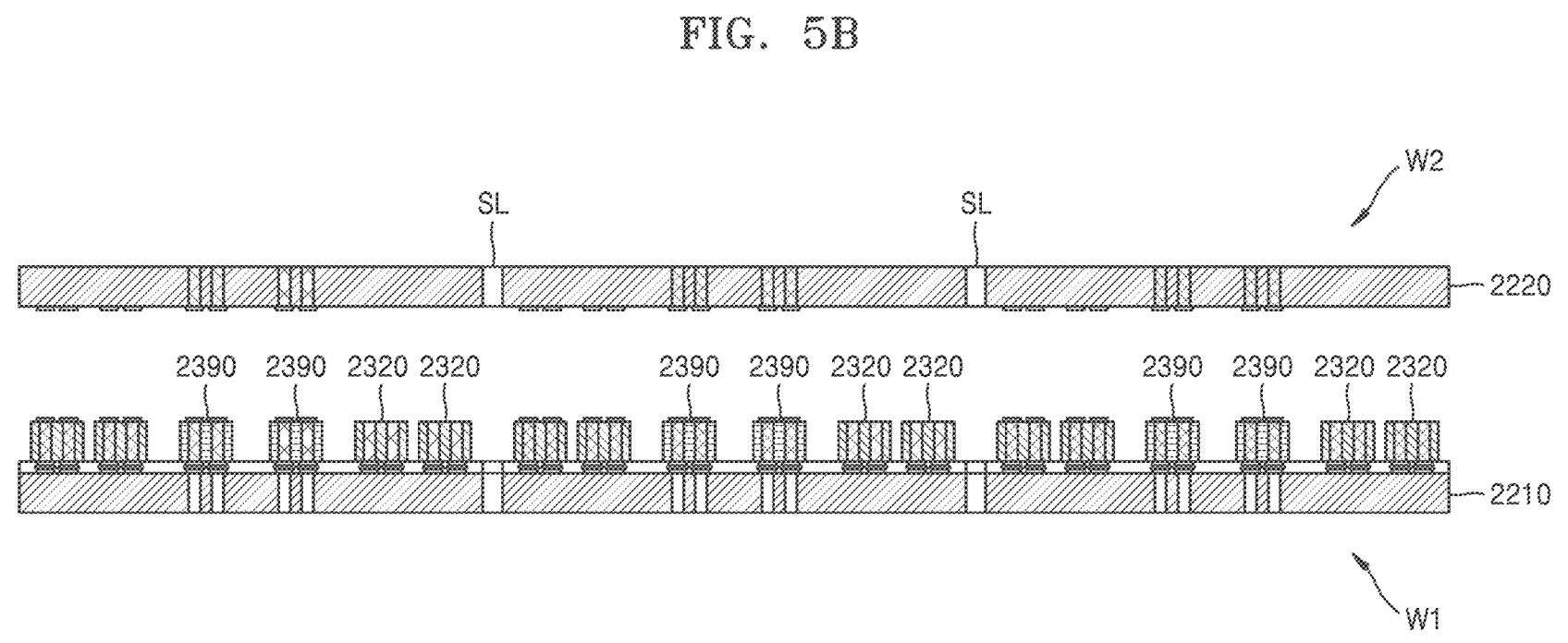
Figure 5C:
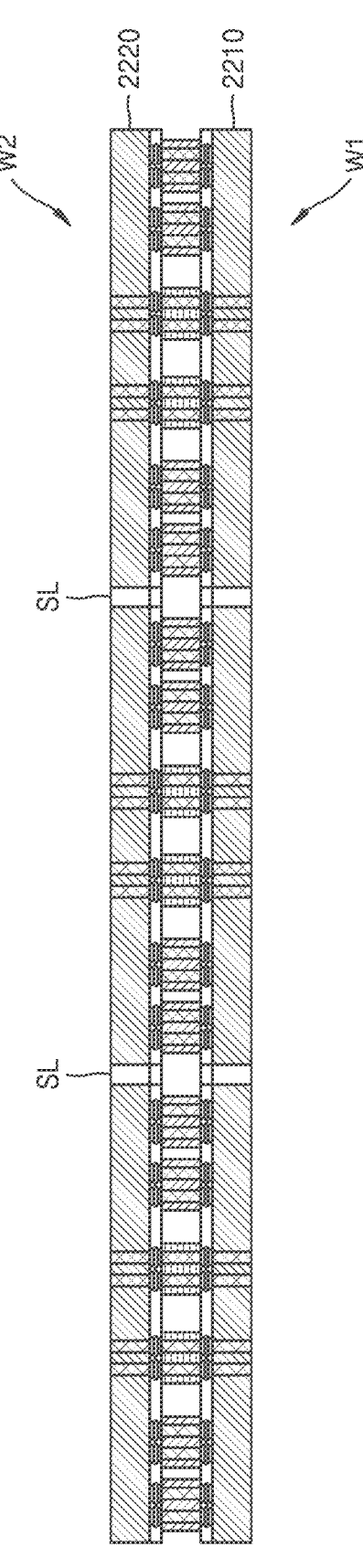
Figure 5D:
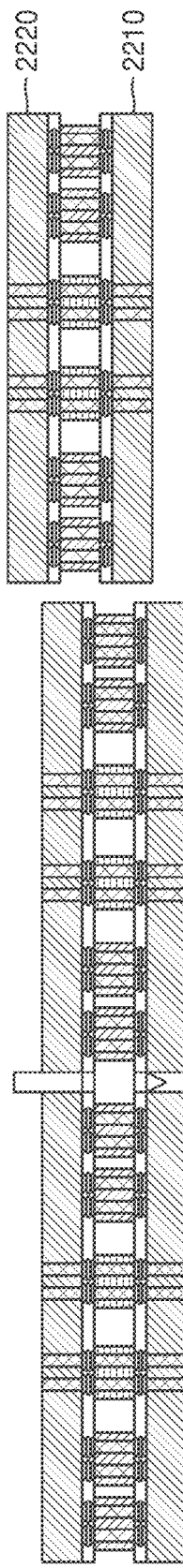

FIG. 5A is a flowchart of a method of manufacturing a semiconductor package, according to example embodiments. FIGS. 5B to 5D are cross-sectional views for describing a method of manufacturing a semiconductor package, according to example embodiments.

Referring to FIGS. 5A and 5B, in operation P210, the first chiplets 2320, the second chiplets 2360, and the interposers 2390 may be mounted on the first wafer W1 on which the first memory chips 2210 are formed.

Referring to FIGS. 5A and 5C, subsequently, in operation P220, the second wafer W2 on which the second memory chips 2220 are formed may be bonded to the first wafer W1 on which the first chiplets 2320, the second chiplets 2360, and the interposers 2390 are mounted.

According to embodiments, the first wafer and the second wafer may be bonded to each other through wafer-to-wafer bonding. According to example embodiments, the wafer-to-wafer bonding may include direct bonding, surface activated bonding, plasma activated bonding, anodic bonding, eutectic bonding, glass frit bonding, adhesive bonding, thermocompression bonding, reactive bonding, and transient liquid phase diffusion bonding.

Referring to FIGS. 5A and 5D, subsequently, in operation P230, the first wafer W1 and the second wafer W2 may be individualized. The first wafer W1 and the second wafer W2 may be separated by a separating means like a blade or a laser.

Figure 6:
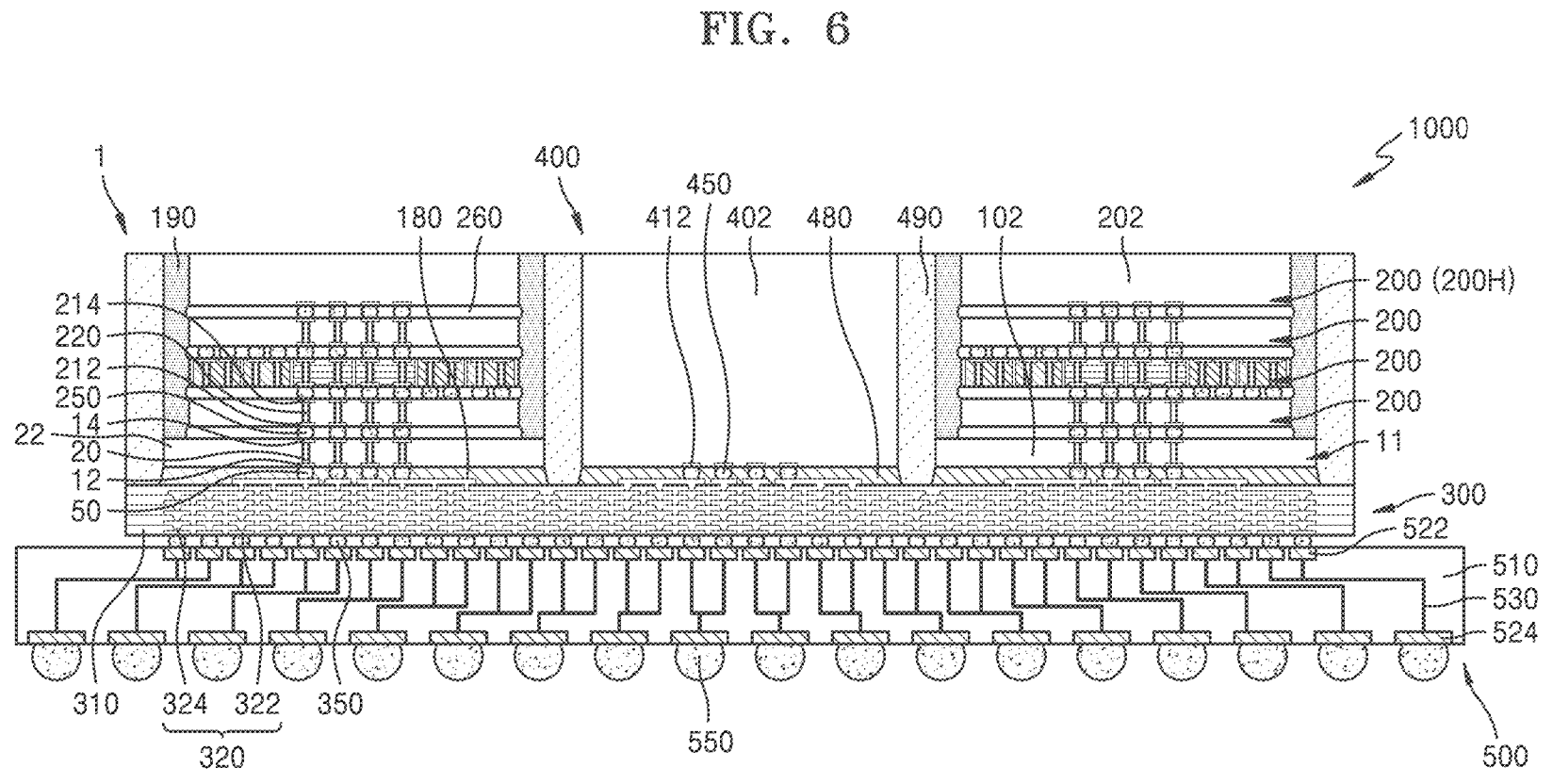

FIG. 6 is a cross-sectional view of a semiconductor package according to an embodiment.

Referring to FIG. 6, a semiconductor package 1000 includes a package base substrate 500, a redistribution structure 300 attached onto the package base substrate 500, at least one stack structure 1 including a first memory chip 11 attached onto the redistribution structure 300 and a plurality of second memory chips 200 stacked on the first memory chip 11, and a semiconductor chip 400 attached onto the redistribution structure 300. The at least one stack structure 1 and the semiconductor chip 400 may be spaced apart from each other in a horizontal direction and attached onto the redistribution structure 300.

Here, the at least one stack structure 1 may correspond to the semiconductor chip stack structure 2000 of FIG. 3A. The first memory chip 11 may correspond to the buffer chip 2100 of FIG. 3A. Also, the second memory chips 200 may correspond to the first to fourth memory chips 2210, 2220, 2230, and 2240 of FIG. 3A. Also, the second memory chips 200 may include a plurality of chiplets, that is, the first chiplets 2320 and the second chiplets 2360, and the interposers 2390 of FIG. 3A.

The package base substrate 500 may include a base board layer 510 and a plurality of board upper pads 522 and a plurality of board lower pads 524 respectively arranged on the top surface and the bottom surface of the base board layer 510. The package base substrate 500 may include a plurality of board wiring paths 530 for electrically connecting the plurality of board upper pads 522 to the plurality of board lower pads 524 through the base board layer 510.

In some embodiments, the redistribution structure 300 may be an interposer. For example, the redistribution structure 300 may be a redistribution layer (RDL) interposer. The redistribution structure 300 may include a redistribution insulation layer 310 and a plurality of redistribution patterns 320.

A plurality of redistribution line patterns 322 may be arranged on at least one of the top surface and the bottom surface of the redistribution insulation layer 310. A plurality of redistribution vias 324 may penetrate through at least one redistribution insulation layer 310 and contact and be connected to portions of the plurality of redistribution line patterns 322, respectively.

According to some embodiments, the first memory chip 11 may be a buffer chip for controlling HBM DRAM, and the plurality of second memory chips 200 may be memory cell chips having HBM DRAM cells controlled by the first memory chip 11.

The first memory chip 11 and the second memory chips 200 may include a first semiconductor device and a second semiconductor device configured by a plurality of individual devices. The first semiconductor device may be formed on a first active surface of a first substrate 22, a plurality of first front connection pads 12 and a plurality of first rear connection pads 14 may be respectively arranged on the first active surface and a first inactive surface of the first substrate 22, and a plurality of first via electrodes 20 may vertically penetrate through at least a portion of the first substrate 22 and electrically interconnect the plurality of first front connection pads 12 to the plurality of first rear connection pads 14.

The second semiconductor device may be formed on a second active surface of a second substrate 202, a plurality of second front connection pads 212 and a plurality of second rear connection pads 214 may be respectively arranged on the second active surface and a second inactive surface of the second substrate 202, and a plurality of second via electrodes 220 may vertically penetrate through at least a portion of the second substrate 202 and electrically interconnect the plurality of second front connection pads 212 and the plurality of second rear connection pads 214. The plurality of second via electrodes 220 may be electrically connected to the plurality of first via electrodes 20.

According to some embodiments, from among the plurality of second memory chips 200, a topmost second memory chip 200H located farthest from the first memory chip 11 may not include a second rear connection pad 214 and a second via electrode 220. According to some embodiments, the topmost second memory chip 200H located farthest from the first memory chip 11 from among the plurality of second memory chips 200 may have a greater thickness than the other second memory chips 200.

An insulating adhesive layer 260 may be provided between the first memory chip 11 and each of the plurality of second memory chips 200. The insulating adhesive layer 260 may be attached to the bottom surface of each of the plurality of second memory chips 200 to attach each of the plurality of second memory chips 200 to a structure therebelow, e.g., the first memory chip 11 or another second memory chip 200 below from among the plurality of second memory chips 200.

The semiconductor chip 400 may include, for example, one of a CPU chip and a graphics processing unit (GPU) chip.

The semiconductor chip 400 may include a third substrate 402 and a plurality of third front connection pads 412. The third substrate 402 may have an active surface and an inactive surface opposite to the active surface. The semiconductor chip 400 may include a third semiconductor device. The third semiconductor device may be formed on the active surface of the third substrate 402, and the plurality of third front connection pads 412 may be arranged on the active surface of the third substrate 402.

The semiconductor chip 400 may be electrically connected to the redistribution structure 300 through the plurality of third front connection pads 412. According to some embodiments, a plurality of third chip connection terminals 450 are provided between the plurality of third front connection pads 412 and a plurality of redistribution lower pads from among the plurality of redistribution line patterns 322 to electrically interconnect the plurality of third front connection pads 412 to the plurality of redistribution lower pads.

The semiconductor package 1000 may further include a package molding layer 490 surrounding the at least one stack structure 1 and the semiconductor chip 400 on the redistribution structure 300.

The memory device and semiconductor package according to example embodiments may be applied to a machine learning system.

The machine learning system may include any of various artificial neural networks and processing models including a convolutional neural network (CNN), a deconvolutional neural network, a recurrent neural network (RNN) that selectively includes a long short-term memory (LSTM) and/or a gated recurrent unit (GRU), a stacked neural network (SNN), a state-space dynamic neural network (SSDNN), a deep belief network (DBN), a generative adversarial network (GAN), and/or a restricted Boltzmann machine (RBM).

The machine learning system may include, for example, linear regression and/or logistic regression, statistical clustering, Bayesian classification, decision trees, dimensionality reduction such as principal component analysis, another type of machine learning model such as an expert system, and/or an ensemble method such as random forest. The machine learning model may be used to provide various services such as an image classification service, a biometric information or biometric data-based user authentication service, an advanced driver assistance system (ADAS), a voice assistant service, and an automatic speech recognition (ASR), and may be mounted and executed in another electronic device.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While embodiments of inventive concepts have been particularly shown and described with reference to embodiments thereof, it will be understood that various changes in form and details may be made therein without departing from the spirit and scope of the following claims.

What is claimed is:

1. A semiconductor chip stack structure comprising:
a buffer chip;
a first memory chip on the buffer chip, the first memory chip including a plurality of first banks;
a second memory chip on the first memory chip, the second memory chip including a plurality of second banks;
first chiplets between the first memory chip and the second memory chip, the first chiplets being and configured to perform calculations on data stored in the plurality of first banks of the first memory chip;
second chiplets between the first memory chip and the second memory chip, the second chiplets being configured to perform calculations on data stored in the plurality of second banks of the second memory chip; and
a third memory chip on the buffer chip, the third memory chip including a plurality of third banks, and the third memory chip being electrically connected to the first memory chip and the second memory chip.

2. The semiconductor chip stack structure of claim 1, wherein
the first memory chip comprises first pads,
the first pads connect the first chiplets to the first memory chip,
the second memory chip comprises second pads, and
the second pads connect the second chiplets to the second memory chip.

3. The semiconductor chip stack structure of claim 2, wherein
the first pads are on an edge region of the first memory chip, and
the second pads are on an edge region of the second memory chip.

4. The semiconductor chip stack structure of claim 2, wherein
the first pads are on a top surface of the first memory chip, and
the second pads are on a bottom surface of the second memory chip.

5. The semiconductor chip stack structure of claim 2, wherein
the first memory chip comprises third pads,
the third pads connect the second chiplets to the first memory chip,
the second memory chip comprises fourth pads, and
the fourth pads connect the first chiplets to the second memory chip.

6. The semiconductor chip stack structure of claim 1, further comprising:
interposers between the first memory chip and the second memory chip, wherein
the interposers comprise interposer via electrodes,
the interposer via electrodes extend in a first direction, and
the first direction is perpendicular to a top surface of the buffer chip.

7. The semiconductor chip stack structure of claim 6, wherein
the interposer via electrodes are connected to first via electrodes of the first memory chip and second via electrodes of the second memory chip.

8. The semiconductor chip stack structure of claim 6, wherein the first chiplets and the second chiplets surround the interposers.

9. The semiconductor chip stack structure of claim 6, wherein the interposers overlap central portions of the first memory chip and the second memory chip.

10. The semiconductor chip stack structure of claim 1, wherein
the first chiplets comprise first chiplet via electrodes extending in a first direction,
the second chiplets comprise second chiplet via electrodes extending in the first direction, and
the first direction is perpendicular to a top surface of the buffer chip.

11. The semiconductor chip stack structure of claim 1, wherein
an active surface of the first memory chip faces active surfaces of the first chiplets, and
an active surface of the second memory chip faces active surfaces of the second chiplets.

12. The semiconductor chip stack structure of claim 1, wherein
an active surface of the first memory chip and an active surface of the second memory chip face each other.

13. The semiconductor chip stack structure of claim 1, wherein the first memory chip, the second memory chip, and the third memory chip do not include a computing circuit.

14. A semiconductor chip stack structure comprising:
a first memory chip including a plurality of first banks;
a second memory chip on the first memory chip, the second memory chip including a plurality of second banks; and
a plurality of chiplets between the first memory chip and the second memory chip, the plurality of chiplets being configured to perform calculations on data stored in the plurality of first banks and the plurality of second banks.

15. The semiconductor chip stack structure of claim 14, further comprising:

interposers between the first memory chip and the second memory chip, wherein first via electrodes of the first memory chip and second via electrodes of the second memory chip are respectively connected to interposer via electrodes of the interposers, the first via electrodes, the second via electrodes, and the interposer via electrodes extend in a first direction, and the first direction is perpendicular to a top surface of the first memory chip.

16. The semiconductor chip stack structure of claim 14, further comprising:

a third memory chip on the second memory chip, the third memory chip comprising a plurality of third banks, wherein an inactive surface of the second memory chip faces an inactive surface of the third memory chip.

17. The semiconductor chip stack structure of claim 16, wherein each of the plurality of chiplets is configured to perform calculations of data stored in any one of the plurality of first banks and any one of the plurality of second banks.

18. A semiconductor package comprising:

a redistribution structure;

a semiconductor chip stack structure on the redistribution structure, the semiconductor chip stack structure including first memory chips and a plurality of second memory chips stacked on the first memory chips;

a plurality of chiplets between two of the plurality of second memory chips adjacent to each other; and a semiconductor chip on the redistribution structure, the semiconductor chip being spaced apart from the semiconductor chip stack structure in a horizontal direction, wherein the first memory chips include a plurality of first banks, and the plurality of second memory chips include a plurality of second banks.

19. The semiconductor package of claim 18, wherein the semiconductor chip and the plurality of chiplets each comprise computing circuits, and the first memory chips and the plurality of second memory chips each do not include a computing circuit.

20. The semiconductor package of claim 19, wherein the plurality of chiplets are configured to perform calculations of data stored in the plurality of first banks and the plurality of second banks.

\* \* \* \* \*